(12) United States Patent
Iwatani

(10) Patent No.: US 10,185,226 B2
(45) Date of Patent: Jan. 22, 2019

(54) STAGE APPARATUS, LITHOGRAPHY APPARATUS, AND METHOD OF MANUFACTURING ARTICLE

(71) Applicant: CANON KABUSHIKI KAISHA, Tokyo (JP)

(72) Inventor: Satoshi Iwatani, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/642,782

(22) Filed: Jul. 6, 2017

(65) Prior Publication Data
US 2018/0017874 A1   Jan. 18, 2018

(30) Foreign Application Priority Data

Jul. 14, 2016 (JP) ................................. 2016-139696
May 12, 2017 (JP) ................................. 2017-095848

(51) Int. Cl.
*G03F 7/20* (2006.01)
*H01L 21/683* (2006.01)
*H01L 21/687* (2006.01)
*G03F 7/00* (2006.01)

(52) U.S. Cl.
CPC ........ *G03F 7/70716* (2013.01); *G03F 7/0002* (2013.01); *G03F 7/707* (2013.01); *G03F 7/708* (2013.01); *G03F 7/70783* (2013.01); *G03F 7/70808* (2013.01); *G03F 7/70866* (2013.01); *G03F 7/70875* (2013.01); *H01L 21/683* (2013.01); *H01L 21/687* (2013.01)

(58) Field of Classification Search
CPC .. G03F 7/707; G03F 7/70716; G03F 7/70783; G03F 7/70808; G03F 7/708; G03F 7/70866; H01L 21/682; H01L 21/683; H01L 21/687
See application file for complete search history.

(56) References Cited

U.S. PATENT DOCUMENTS

| | | | |
|---|---|---|---|
| 7,193,687 B2 | 3/2007 | Kubo | |
| 7,282,874 B2 | 10/2007 | Shibata et al. | |
| 2006/0139614 A1* | 6/2006 | Owa | G03B 27/58 355/72 |

FOREIGN PATENT DOCUMENTS

| | | |
|---|---|---|
| JP | 2003163257 A | 6/2003 |
| JP | 2006211812 A | 8/2006 |

* cited by examiner

*Primary Examiner* — Michelle M Iacoletti
(74) *Attorney, Agent, or Firm* — Rossi, Kimms & McDowell LLP

(57) ABSTRACT

The present invention provides a stage apparatus including a plate, wherein the plate includes a first plate member, a second plate member, and a third plate member, at least one surface out of a first surface of the first plate member on a side of the second plate member and a second surface of the second plate member on a side of the first plate member includes a first concave portion configured to form a first channel extending in a direction along the surface, at least one surface out of a third surface of the second plate member on a side of the third plate member and a fourth surface of the third plate member on the side of the second plate member includes a second concave portion configured to form a second channel extending in a direction along the surface.

19 Claims, 8 Drawing Sheets

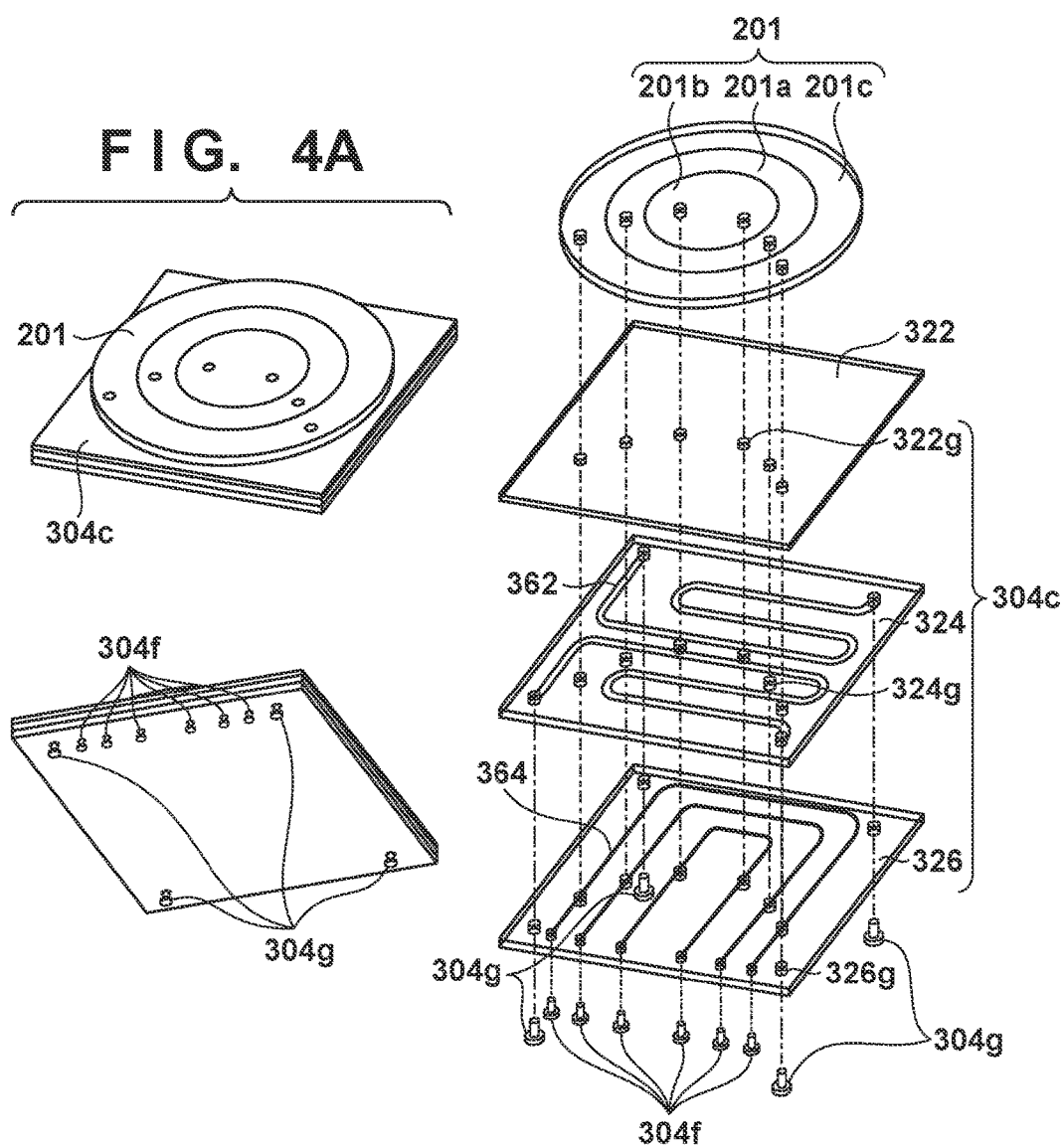

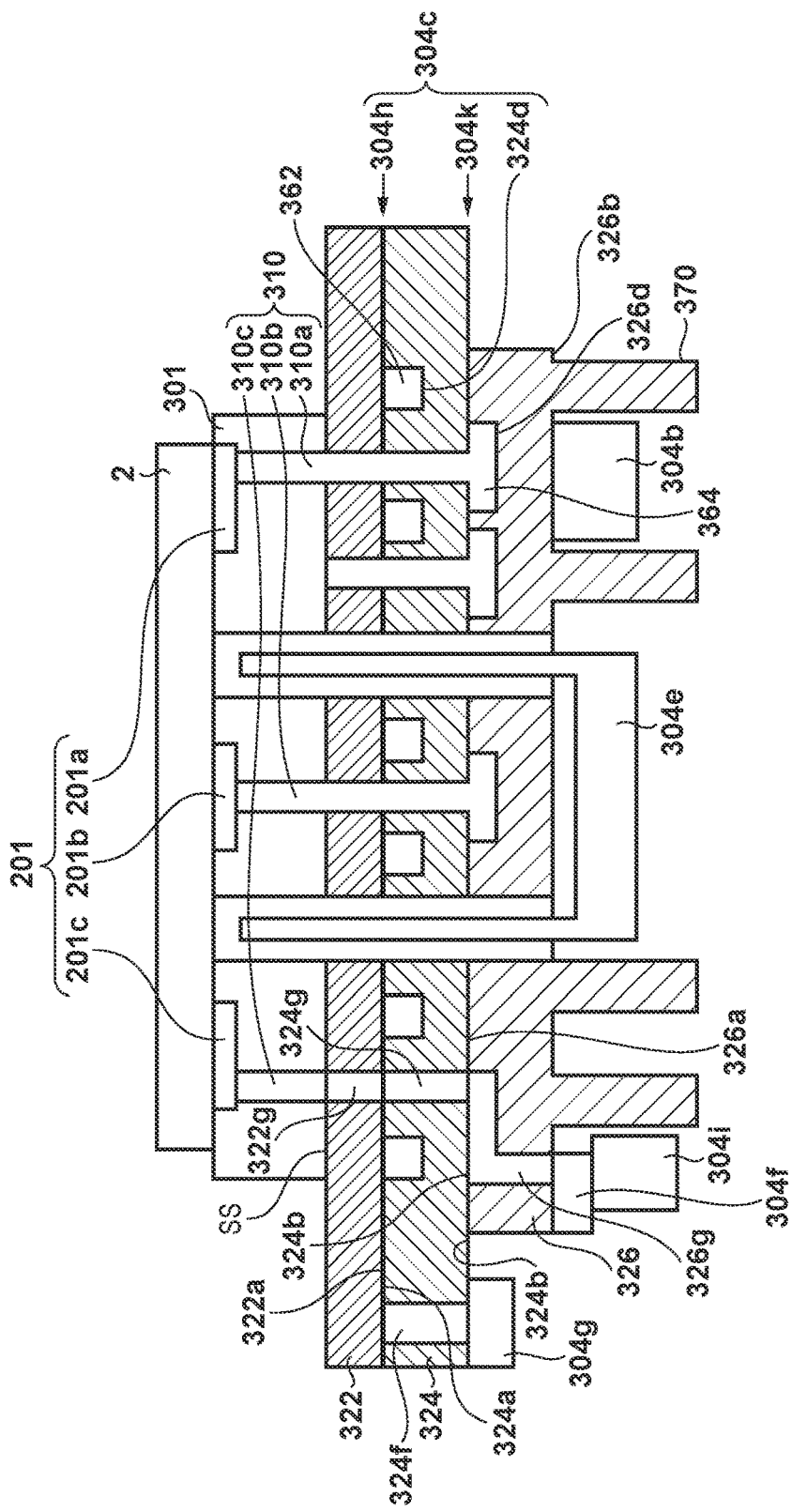

STAGE APPARATUS, LITHOGRAPHY APPARATUS, AND METHOD OF MANUFACTURING ARTICLE

BACKGROUND OF THE INVENTION

Field of the Invention

The present invention relates to a stage apparatus, a lithography apparatus, and a method of manufacturing an article.

Description of the Related Art

Japanese Patent Laid-Open No. 2003-163257; proposes, as a technique regarding a stage apparatus, a technique of causing a stage plate to have a hollow rib structure in order to achieve both the high stiffness and light weight of the stage plate. Japanese Patent Laid-Open No. 2003-163257 discloses a technique of performing negative pressure suction in order to hold a substrate by a chuck placed on the stage plate. It is necessary to make a hole formed in the chuck and an outside (negative pressure pump) communicate with each other by using a pipe or the like when negative pressure suction is performed. However, Japanese Patent Laid-Open No. 2003-163257 does not disclose such a configuration specifically.

Japanese Patent Laid-Open No. 2006-211812 proposes a technique of forming a refrigerant channel on a joint surface inside a stage plate and reducing the influence of thermal deformation of the stage plate. Also in Japanese Patent Laid-Open No. 2006-211812, it is necessary to form a hole in a gap of the refrigerant channel and make, by using a pipe or the like, portions from the lower surface of the stage plate to the upper surface of a chuck communicate with each other when negative pressure suction is performed in order to hold the chuck. However, Japanese Patent Laid-Open No. 2006-211812 does not disclose such a configuration specifically.

In recent years, an improvement in productivity for a lithography apparatus such as an exposure apparatus or an imprint apparatus is demanded, and a stage apparatus capable of positioning a substrate at a high speed and accuracy in the apparatus is required. Accordingly, in order to improve the control performance of the stage apparatus, the high stiffness and light weight of a stage movable portion are improved. An arrangement is proposed in which, in the imprint apparatus, a plurality of chucking holes are formed in a chuck provided on the stage apparatus and chucking can be turned ON/OFF for each region on the substrate. In such an arrangement, the number of pipes needed for communication tends to be larger than before.

In Japanese Patent Laid-Open No. 2003-163257, however, it is difficult to arrange a pipe inside a thick stage plate of the hollow rib structure because the stage plate is provided immediately below the chuck. Furthermore, the light weight is impaired if the thick part of the stage movable portion is increased in order to form a through hole communicating with a corresponding one of the chucking holes in the chuck.

In a case in which the refrigerant channel is formed in the joint surface of the stage plate having the hollow rib structure, a through hole (negative pressure path) which communicates portions from the lower surface of the stage plate to the upper surface of the chuck needs to be formed so as not to interfere with a rib provided on the stage plate. Consequently, the negative pressure path becomes complicated under constraints of layouts such as the hollow rib structure and an implementation in the stage plate, impairing the stiffness and light weight of the entire stage movable portion.

SUMMARY OF THE INVENTION

The present invention provides a stage apparatus advantageous in high stiffness and light weight.

According to one aspect of the present invention, there is provided a stage apparatus which holds a substrate via a chuck with a chucking hole for chucking the substrate, the apparatus including a plate configured to support the chuck on a support surface, wherein the plate includes a first plate member, a second plate member, and a third plate member from a side of the support surface in a thickness direction, at least one surface out of a first surface of the first plate member on a side of the second plate member and a second surface of the second plate member on a side of the first plate member includes a first concave portion configured to form a first channel extending in a direction along the surface, at least one surface out of a third surface of the second plate member on a side of the third plate member and a fourth surface of the third plate member on the side of the second plate member includes a second concave portion configured to form a second channel extending in a direction along the surface, and one of the first channel and the second channel communicates with the chucking hole.

Further features of the present invention will become apparent from the following description of exemplary embodiments with reference to the attached drawings.

BRIEF DESCRIPTION OF THE DRAWINGS

FIGS. 4A and 4B are views showing a chuck and the stage plate of the stage apparatus shown in FIGS. 2A and 2B.

FIG. 5 is a sectional view showing the stage plate of the stage apparatus shown in FIGS. 2A and 2B.

DESCRIPTION OF THE EMBODIMENTS

Figure 1:
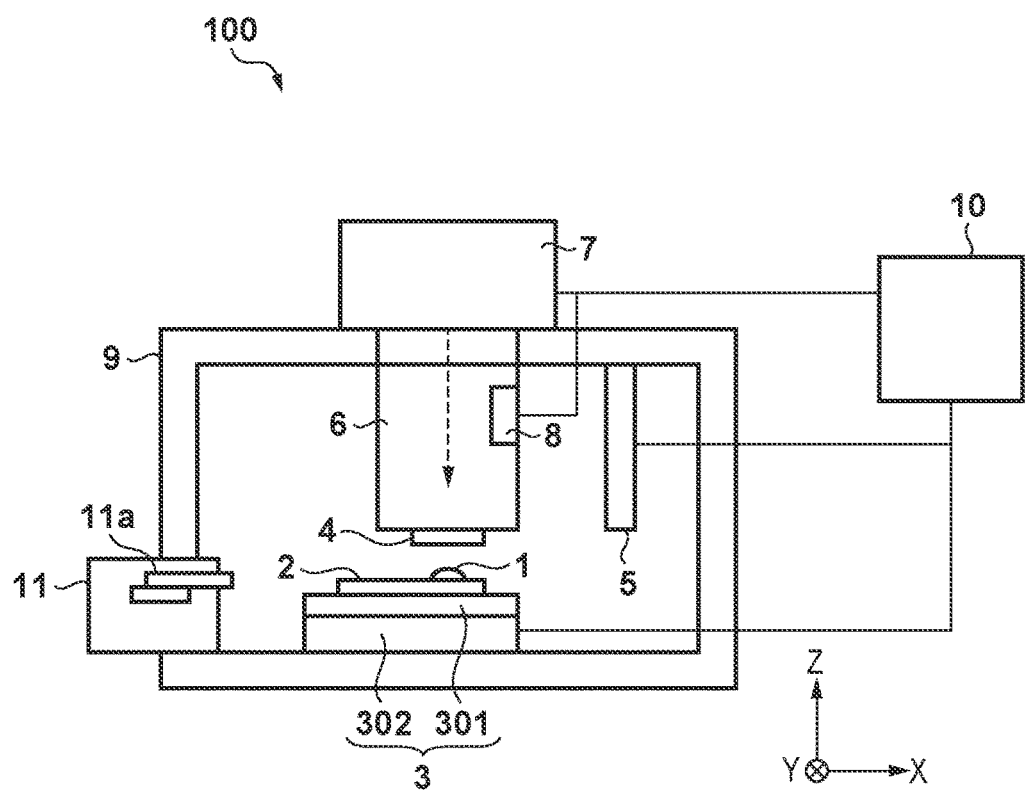
FIG. 1 is a schematic view showing the arrangement of an imprint apparatus according to an aspect of the present invention.

Preferred embodiments of the present invention will be described below with reference to the accompanying drawings. Note that the same reference numerals denote the same members throughout the drawings, and a repetitive description thereof will not be given.

FIG. 1 is a schematic view showing the arrangement of an imprint apparatus 100 according to an aspect of the present invention. The imprint apparatus 100 is a lithography apparatus which is used to manufacture a semiconductor device or the like and forms a pattern on a substrate. The imprint apparatus 100 performs an imprint process of forming a pattern in an imprint material 1 on the substrate by using a mold 4. In this embodiment, the imprint apparatus 100 brings the mold 4 and the imprint material 1 supplied onto the substrate into contact with each other, and applies curing energy to the imprint material 1, forming the pattern of a cured product to which the three-dimensional pattern of the mold 4 has been transferred.

A curable composition (may also be referred to as an uncured resin) which is cured by receiving curing energy is used for the imprint material 1. An electromagnetic wave, heat, or the like is used as the curing energy. For example, light such as infrared light, visible rays, ultraviolet light, or the like whose wavelength is selected from a range of 10 nm (inclusive) to 1 mm (inclusive) is used as the electromagnetic wave.

The curable composition is a composition that is cured by light irradiation or application of heat. A photo-curable composition that is cured by light irradiation contains at least a polymerizable compound and a photopolymerization initiator, and may contain a non-polymerizable compound or solvent as needed. The non-polymerizable compound is at least a material selected from the group consisting of a sensitizer, a hydrogen donor, an internal mold release agent, a surfactant, an antioxidant, a polymer component, and the like.

The imprint material 1 may be applied on the substrate in a film-like shape by a spin coater or a slit coater. Alternatively, a liquid injection head may apply, on the substrate, the imprint material 1 having a droplet-like shape, or an island-like shape or a film-like shape formed by a plurality of droplets connected to each other. The viscosity (viscosity at 25° C.) of the imprint material 1 is set at, for example, 1 mPa·s (inclusive) to 100 mPa·s (inclusive).

The imprint apparatus 100 includes a stage apparatus 3, a supply unit 5, an imprint head 6, a curing unit 7, a measurement unit 8, a structure 9, a control unit 10, and a conveying unit 11. The supply unit 5, the imprint head 6, the curing unit 7, and the measurement unit 8 are supported by the structure 9. The stage apparatus 3 is configured to move on a surface plate. The control unit 10 includes, for example, a CPU, a memory, and the like, and performs the imprint process by controlling the respective units of the imprint apparatus 100.

The mold 4 is made of a material such as quartz or the like capable of transmitting light (for example, ultraviolet light) that cures the imprint material 1. A three-dimensional pattern for forming the imprint material 1 on the substrate is formed in a partial region on a substrate-side surface of the mold 4. A substrate 2 includes, for example, a single-crystal silicon substrate, a glass substrate, or the like.

The supply unit 5 supplies (applies) the imprint material 1 to the surface of the substrate 2. The imprint head 6 includes, for example, a mold chuck which holds the mold 4 by a vacuum chucking force or an electrostatic force and a mold driving unit which drives the mold chuck in a Z-axis direction.

In the imprint process, the curing unit 7 irradiates, via the mold 4, the imprint material 1 on the substrate with the light that cures the imprint material 1, curing the imprint material 1. The measurement unit 8 detects an alignment mark provided in the mold 4 (a pattern region thereof) and an alignment mark provided in the substrate 2 (a shot region thereof), and measures the relative positions (positional shift) of the mold 4 and the substrate 2.

The conveying unit 11 includes a robot hand 11a and conveys the substrate 2. The conveying unit 11 loads the substrate 2 inside the imprint apparatus 100 and transfers the substrate 2 to the stage apparatus 3. The conveying unit 11 also receives the substrate 2 from the stage apparatus 3 and unloads the substrate 2 outside the imprint apparatus 100.

The stage apparatus 3 holds the substrate 2 via a chuck 301 which holds the substrate 2 by a vacuum chucking force. The stage apparatus 3 includes a movable unit 302 configured to move on the surface plate while supporting the chuck 301, and performs positioning of the substrate 2 in an X-axis direction and a Y-axis direction. The stage apparatus 3 may also have a function of adjusting the position of the substrate 2 in the Z-axis direction or a θdirection, or a function of correcting the tilt of the substrate 2.

Figure 2A:
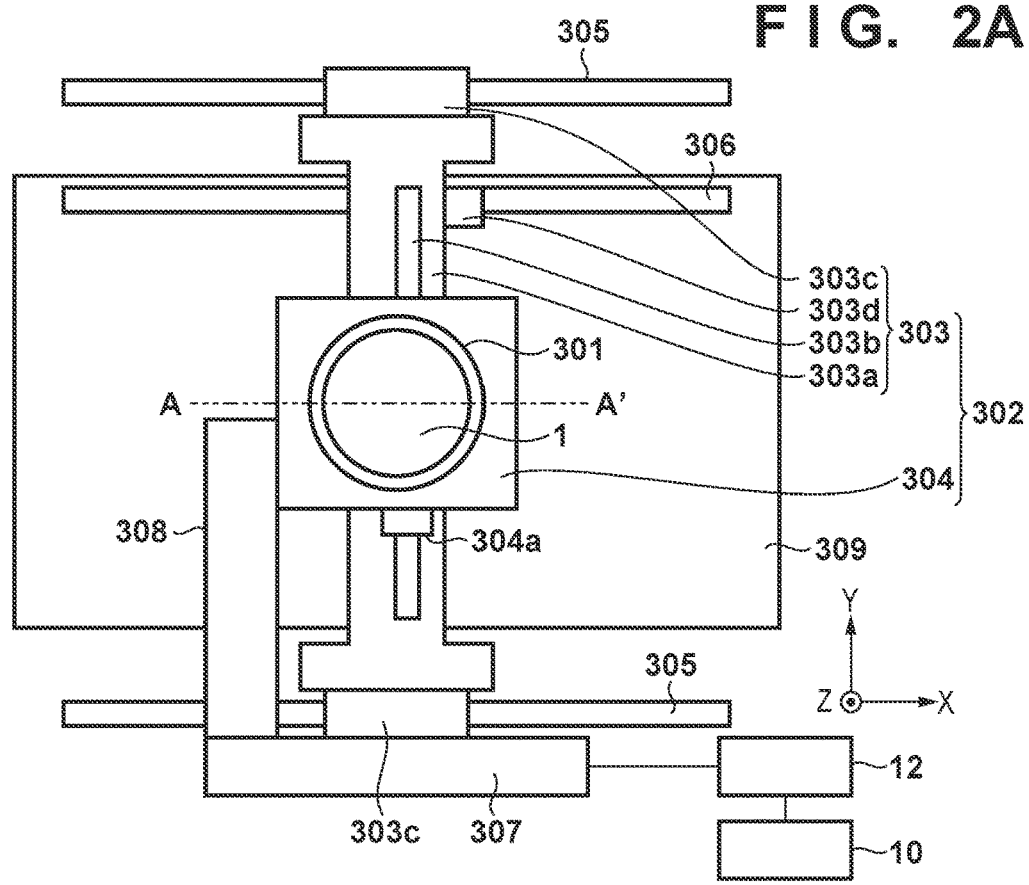
FIGS. 2A and 2B are views each showing the arrangement of a stage apparatus of the imprint apparatus shown in FIG. 1.
Figure 2B:
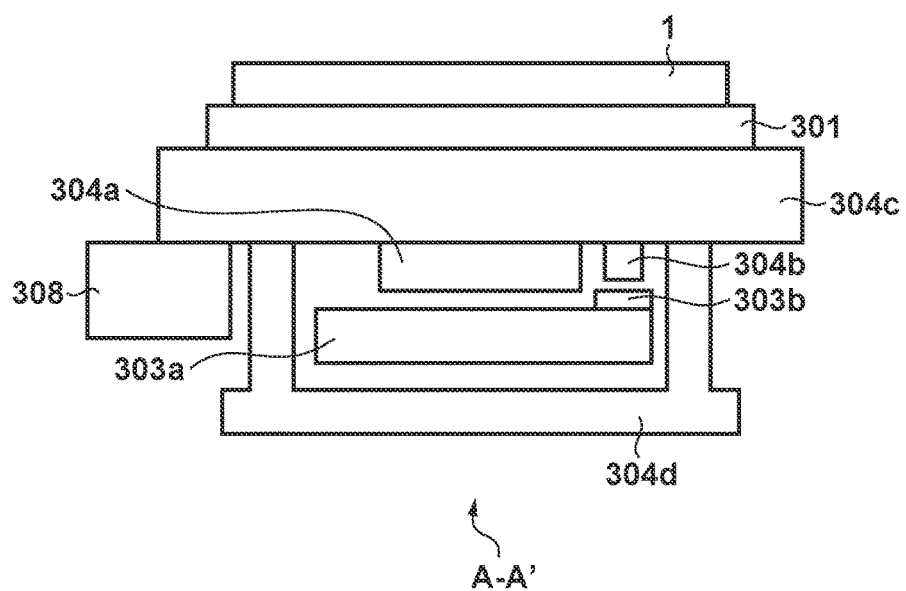

The arrangement of the stage apparatus 3 will be described with reference to FIGS. 2A and 2B. FIG. 2A is a plan view showing the stage apparatus 3 in the Z-axis direction. FIG. 2B is a sectional view taken along a line A-A' of the stage apparatus 3 shown in FIG. 2A. The stage apparatus 3 includes the movable unit 302 with, for example, an X stage 303 and a Y stage 304. The X stage 303 is configured to move on a surface plate 309 in the X-axis direction. The Y stage 304 is configured to hold the chuck 301 and move in the Y-axis direction via a static pressure guide (not shown).

The movable unit 302 thus configured can move the Y stage 304 and the chuck 301 in the X-axis direction by moving the X stage 303 in the X-axis direction. The movable unit 302 can also move the chuck 301 in the Y-axis direction by moving the Y stage 304 in the Y-axis direction. Therefore, the stage apparatus 3 can move the substrate 2 in the X-axis direction and the Y-axis direction.

The static pressure guide performs positioning of the X stage 303 so as to form a gap having a predetermined amount with respect to the surface plate 309. X driving units 303c drive the X stage 303 on the surface plate in the X-axis direction. The X driving units 303c include linear motors that include, for example, movers with a plurality of coils and stators 305 with permanent magnets arranged in the X-axis direction. The X driving units 303c implement cooling units configured to cool the coils.

For example, a measurement unit that includes an encoder, an interferometer, and the like measures the position of the X stage 303 in an X direction. In this embodiment, an encoder that includes an X scale 306 and an X head 303d is provided as the measurement unit which measures the position of the X stage 303 in the X direction.

The static pressure guide performs positioning of the Y stage 304 so as to form a gap having a predetermined amount with respect to the X stage 303. A Y driving unit 304a drives the Y stage 304 on an X beam 303a in the Y-axis direction. As in the X driving units 303c, the Y driving unit 304a includes a linear motor. The Y driving unit 304a also implements a cooling unit configured to cool the coils.

For example, a measurement unit that includes an encoder, an interferometer, and the like measures the position of the Y stage 304 in a Y direction. In this embodiment, an encoder that includes a Y scale 303b and a Y head 304b arranged in the X beam 303a is provided as the measurement unit which measures the position of the Y stage 304 in the Y direction.

For example, a power/utility facility 12 installed inside or outside the imprint apparatus 100 is used to supply power and utility to the stage apparatus 3. First, power supply to the stage apparatus 3, refrigerant supply to cooling implementations 304g, and exhaustion and negative pressure (vacuum) suction for a corresponding one of suction implementations 304f and a pressure regulating unit 304i are performed from the power/utility facility 12. The power/utility facility 12 is connected to an X movable implementation 307 movable in the X-axis direction, and performs power supply and utility supply to the X stage 303. The power/utility facility 12 is also connected to, via the X movable implementation 307, a Y movable implementation 308 movable in the Y-axis direction, and performs power supply and utility supply to the Y stage 304. Communication (for example, transmission and reception of a detection signal or a control signal) between the measurement units arranged on the X stage 303 and the Y stage 304, for example, between the control unit 10, and the X head 303$d$ and the Y head 304$b$ is performed via the same path as a power and utility supply path.

The arrangement of the Y stage 304 will now be described in detail. The Y stage 304 is mainly made of two structures, and more specifically, a Y slider 304$d$ that includes a static pressure guide (not shown) and a stage plate 304$c$ fixed onto the Y slider 304$d$. The stage plate 304$c$ implements the high stiffness and light weight of the entire movable unit, and is made of a material capable of enhancing a control band, which is generally ceramics such as alumina, silicon carbide, silicon nitride, or cordierite. The stage plate 304$c$ includes at least three plate members, and these plate members are jointed in a thickness direction (Z-axis direction) thereof.

Figure 3:
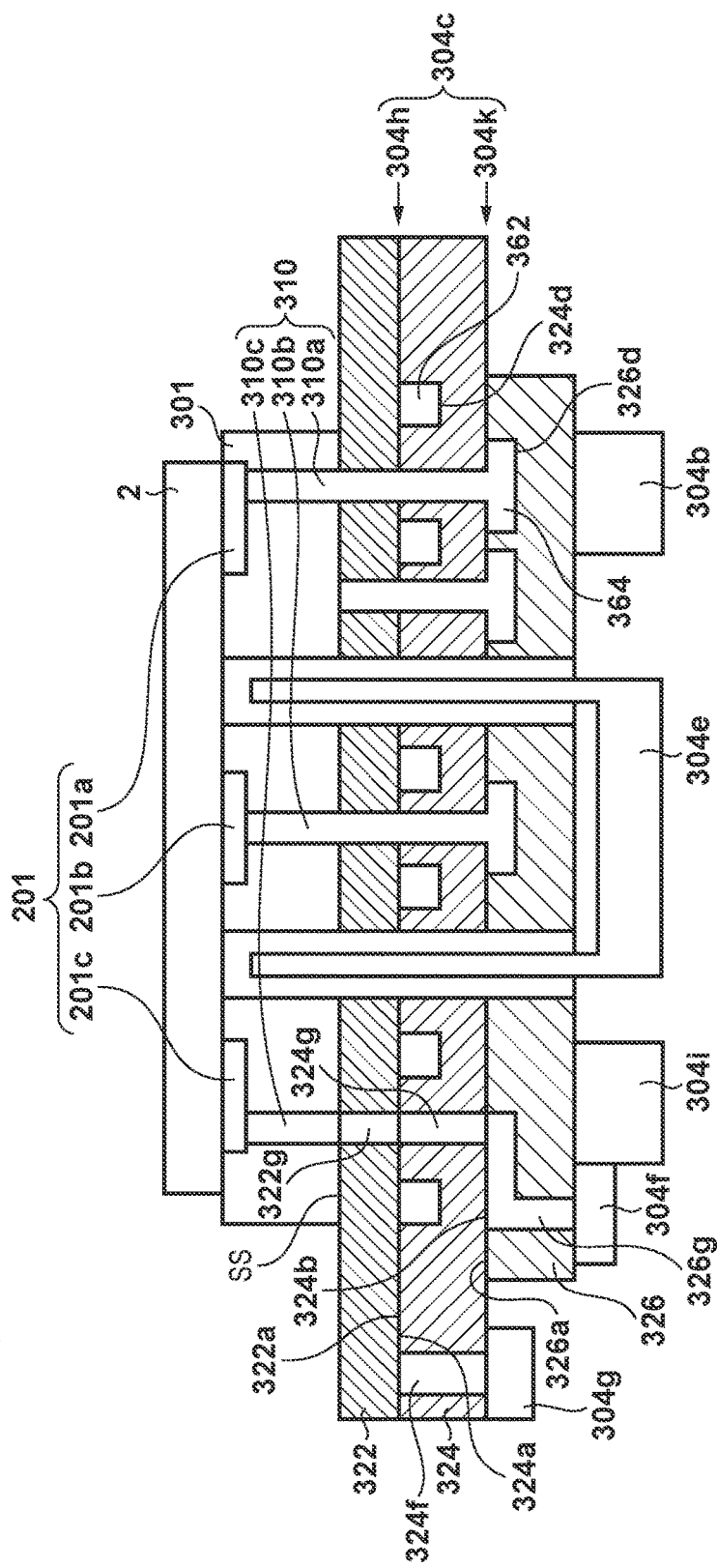
FIG. 3 is a sectional view showing a stage plate of the stage apparatus shown in FIGS. 2A and 2B.

FIG. 3 is a sectional view showing the stage plate 304$c$. FIG. 4A is a view showing the chuck 301 and the stage plate 304$c$ three-dimensionally. FIG. 4B is a developed view showing the internal structure of the stage plate 304$c$. The stage plate 304$c$ supports, on a support surface SS, the chuck 301 having chucking holes 310 for chucking the substrate 2. In this embodiment, the stage plate 304$c$ includes a first plate member 322, a second plate member 324, and a third plate member 326 stacked sequentially from the side of the support surface SS in the thickness direction. An elevating unit 304$e$ configured to elevate the substrate 2, the Y head 304$b$ (measurement unit), the cooling implementations 304$g$, the suction implementations 304$f$, the pressure regulating unit 304$i$, and the like are fixed to the lower surface or side surfaces of the stage plate 304$c$.

Before the imprint process, the substrate 2 loaded inside the imprint apparatus 100 by the conveying unit 11 (robot hand 11$a$) is placed on the elevating unit 304$e$ (elevating pin) moved to a position higher than the chuck 301. The elevating unit 304$e$ holds the substrate 2 by a vacuum chucking force or an electrostatic force. Then, the elevating unit 304$e$ holding the substrate 2 is moved down, transferring the substrate 2 to the chuck 301. After the imprint process, the elevating unit 304$e$ is moved up, raising (separating) the substrate 2 from the chuck 301. In this state, the elevating unit 304$e$ holds the substrate 2 by the vacuum chucking force or the electrostatic force. Then, the conveying unit 11 recovers the substrate 2 held by the elevating unit 304$e$ and unloads it outside the imprint apparatus 100.

Implementations such as a cable and pipe tube related to power supply and utility supply to the elevating unit 304$e$ used to convey the substrate 2 as described above are fixed to the lower surface or side surfaces of the stage plate 304$c$. In other words, the implementations are fixed to a surface different from the support surface SS of the stage plate 304$c$. Implementations such as a signal cable and signal board related to the Y head 304$b$ are also fixed to the lower surface or side surfaces of the stage plate 304$c$ in the same manner. These implementations are connected to, via the Y movable implementation 308, the power/utility facility 12 and the control unit 10.

In the imprint process, the imprint material 1 on the substrate is irradiated with the light that cures the imprint material 1 via the mold 4, as described above. Therefore, heat generated by the light which irradiates the imprint material 1 on the substrate is absorbed into the substrate 2, which may cause thermal deformation of the substrate 2, and a shift in the relative positions of the mold 4 and the substrate 2. It is therefore preferable to cool the substrate 2 from the stage plate 304$c$ via the chuck 301 in order to reduce the thermal deformation of the substrate 2 caused by irradiation with the light that cures the imprint material 1.

It is also necessary, in the imprint apparatus 100, to reduce occurrence of the shift in the relative positions of the mold 4 and the substrate 2 in a mold pressing step of bringing the mold 4 and the imprint material 1 on the substrate into contact with each other or a mold releasing step of releasing the mold 4 from the cured imprint material 1 on the substrate. To achieve this, it is preferable to forcibly deform the substrate 2 by regulating the chucking pressure of each of a plurality of chucking regions 201 for chucking the substrate 2 (the pressure of each chucking hole) so as to suppress the positional shift between the mold 4 and the substrate 2 in accordance with the process of the mold pressing step or the mold releasing step by providing the chucking regions 201.

In this embodiment, the chuck 301 includes, as the plurality of chucking regions 201, three chucking regions 201$a$, 201$b$, and 201$c$. Chucking holes 310$a$, 310$b$, and 310$c$ are formed in the chucking regions 201$a$, 201$b$, and 201$c$, respectively. The chucking regions 201$a$ to 201$c$ are, respectively, connected to, via the chucking holes 310$a$ to 310$c$, the pressure regulating unit 304$i$ connected to the power/utility facility 12. The pressure regulating unit 304$i$ forcibly deforms the substrate 2 (the shot region thereof) by regulating a pressure in a space between the obverse surface of the chuck 301 and the reverse surface of the substrate 2 corresponding to a region which includes a shot region to undergo the imprint process. In this embodiment, the pressure regulating unit 304$i$ regulates (controls) the respective chucking pressures of the chucking regions 201$a$ to 201$c$ independently of each other.

For example, if the pressure regulating unit 304$i$ reduces the pressure of the chucking region 201$b$ to set it in a negative pressure state, it is possible to deform the region of the substrate 2 corresponding to the chucking region 201$b$ into a concave shape while holding the substrate 2 by the chuck 301. On the other hand, if the pressure regulating unit 304$i$ applies a pressure to the chucking region 201$b$ to set it in a positive pressure state, it is possible to deform the region of the substrate 2 corresponding to the chucking region 201$b$ into a convex shape while chucking the substrate 2 in the chucking regions 201$a$ and 201$c$.

The substrate 2 is thus deformed locally by changing the chucking pressures of the chucking regions 201$a$ to 201$c$ in the chuck 301, making it possible to match the shape of the substrate 2 (the shot region thereof) with the shape of the mold 4 in the process of the mold pressing step or the mold releasing step. Note that in this embodiment, the chucking pressures of the chucking regions 201$a$ to 201$c$ in the chuck 301 can be changed in order to correct the flatness of the substrate 2 and, for example, the substrate 2 is not deformed in the Z-axis direction exceeding the correction range of the flatness of the substrate 2.

An arrangement to be described below is needed in order to change the chucking pressures of the respective chucking regions 201$a$ to 201$c$ in a state in which the stage plate 304$c$ supports the chuck 301. For example, an arrangement is needed in which the respective chucking holes 310$a$ to 310$c$ formed in the respective chucking regions 201$a$ to 201$c$ are communicated from the lower part of the support surface SS of the stage plate 304$c$ to the reverse surface of the stage plate 304$c$ independently of each other and connected to the pressure regulating unit 304*i*. In order to achieve such an arrangement, it is necessary to form a plurality of through holes while avoiding an interference with channels formed to cool the chuck 301 on the stage plate 304*c*, and to make these through holes and the chucking holes 310*a* to 310*c* communicate with each other.

The channels for cooling the chuck 301 are generally formed in a direction along an X-Y plane, and the supply port and recovery port of a refrigerant flowing through the channels are formed in a peripheral portion near the outer edge of the stage plate 304*c*. Further, the supply port and recovery port of the refrigerant are connected to a tube routed from the Y movable implementation 308. Furthermore, the elevating unit 304*e*, the Y head 304*b* (measurement unit), the cooling implementations 304*g*, the suction implementations 304*f*, the pressure regulating unit 304*i*, and the like are fixed to the lower surface or side surfaces of the stage plate 304*c*, as described above. Therefore, a space is limited in which, for example, a pipe for performing negative pressure (vacuum) suction in the vertical direction (Z-axis direction) of the stage plate 304*c* can be implemented. Note that even if a plurality of pipes can be implemented in a small gap of the stage plate 304*c*, many implementations need to be fixed, increasing the thickness of the stage plate 304*c* and leading to an increase in weight of the entire movable unit. Additionally, a design constraint that, for example, it becomes impossible, because of the increasing number of implementations, to arrange a rib structure needed to ensure the stiffness of the stage plate 304*c* is large, and layout freedom is decreased greatly.

It is therefore preferable not to arrange, for example, pipes for performing negative pressure suction in the central portion of the stage plate 304*c* but to arrange them concentratedly in the peripheral portion near the outer edge of the stage plate 304*c* in the same manner as the supply port and recovery port of the refrigerant flowing through the channels for cooling the chuck 301. Moreover, the structure of the stage plate 304*c* is simplified by forming a channel for performing negative pressure suction in the direction along the X-Y plane in the same manner as the channels for cooling the chuck 301, making it possible to improve design freedom.

Therefore, in this embodiment, the stage plate 304*c* is arranged as follows. Note that let a first surface 322*a* be the surface of the first plate member 322 on the side of the second plate member 324. Let a second surface 324*a* be the surface of the second plate member 324 on the side of the first plate member 322, and let a third surface 324*b* be the surface of the second plate member 324 on the side of the third plate member 326. Let a fourth surface 326*a* be the surface of the third plate member 326 on the side of the second plate member 324.

The first surface 322*a* is a plane with respect to the first plate member 322 and the second plate member 324, and first concave portions 324*d* are formed in the second surface 324*a*. Consequently, first channels 362 extending in the direction along the X-Y plane are formed in (joint surface) 304*h* between the first plate member 322 and the second plate member 324. The refrigerant for cooling the chuck 301 flows through the first channels 362. In other words, the first channels 362 function as refrigerant channels for cooling the chuck 301. The first channels 362 may include a plurality of channels, and may be able to control the flow rates and the temperature setting values of the respective channels independently of each other. Further, the first channel 362 communicates with a through hole (fourth through hole) 324*f* formed, so as to penetrate in the thickness direction, in the peripheral portion of the second plate member 324 and is connected to, via the through hole 324*f*, a corresponding one of the cooling implementations 304*g* which supplies the refrigerant flowing through the first channel 362. Note that when the cooling implementations 304*g* are implemented on the lower surface of the third plate member 326, a through hole (fifth through hole) which penetrates in the thickness direction in correspondence with the through hole 324*f* can be formed in the third plate member 326, and these through holes and the first channels 362 can be communicated with each other.

The third surface 324*b* is a plane with respect to the second plate member 324 and the third plate member 326, and second concave portions 326*d* are formed in the fourth surface 326*a*. Consequently, second channels 364 extending in the direction along the X-Y plane are formed in (joint surface) 304*k* between the second plate member 324 and the third plate member 326. The second plate member 324 includes through holes (first through holes) 324*g* formed, so as to penetrate in the thickness direction, in a portion different from a portion in which the first channels 362 are formed. The through holes 324*g* are provided in the portion different from the portion in which the first channels 362 are formed, preventing a suction function by the pressure regulating unit 304*i* connected to a corresponding one of the through holes 324*g* and a cooling function in the first channels 362 from interfering with each other. The first plate member 322 includes through holes (second through holes) 322*g* formed so as to penetrate in the thickness direction in correspondence with the through holes 324*g*. The third plate member 326 includes a through hole (third through hole) 326*g* formed, so as to penetrate in the thickness direction, in the peripheral portion of the third plate member 326. Then, the second channels 364 communicate with the chucking holes 310 via the through holes 324*g* and 322*g*, and are connected to the corresponding one of the suction implementations 304*f* and the pressure regulating unit 304*i* in communication with the through hole 326*g*. Therefore, the second channels 364 function as suction channels which perform negative pressure (vacuum) suction on the chucking regions 201 and the chucking holes 310 for chucking the substrate 2. Note that when the suction implementations 304*f* and the pressure regulating unit 304*i* are implemented on the side surface of the third plate member 326, a communication path which communicates the fourth surface 326*a* and the side surface with each other can be formed in the third plate member 326 to make the communication path and the second channels 364 communicate with each other.

As described above, the second channels 364 can communicate from the gap of the first channels 362 to the upper surface (chuck 301) of the stage plate 304*c* without interfering with the first channels 362, and chuck the substrate 2 and the chuck 301. The second channels 364 can include a plurality of channels, and can control the flow rates and the pressure setting values of the respective channels independently of each other. For example, by forming the second channels 364 in correspondence with the respective chucking regions 201*a* to 201*c*, it is possible to regulate the chucking pressures of the respective chucking regions 201*a* to 201*c* independently of each other.

As in this embodiment, it is preferable that the first channels 362 serve as the cooling channels, and the second channels 364 serve as the suction channels. This makes it possible to increase cooling efficiency for the chuck 301 as compared with a case in which the first channels 362 serve as the suction channels, and the second channels 364 serve as the cooling channels. However, the first channels 362 may serve as the suction channels, and the second channels 364 may serve as the cooling channels. In other words, it is only necessary that one of each first channel 362 and each second channel 364 communicates with a corresponding one of the chucking holes 310. Even if the first channels 362 serve as the suction channels, and the second channels 364 serve as the cooling channels, it is only necessary that the respective channels are arranged independently of each other without interfering with each other.

Further, in this embodiment, the first concave portions 324d are formed in the second surface 324a, and the second concave portions 326d are formed in the fourth surface 326a. However, the first concave portions 324d may be formed in the first surface 322a, and the second concave portions 326d may be formed in the third surface 324b. Thus, the first concave portions 324d can be formed in one of the first surface 322a and the second surface 324a, and the second concave portions 326d can be formed in one of the third surface 324b and the fourth surface 326a. Then, the other of the first surface 322a and the second surface 324a can be a plane, and the other of the third surface 324b and the fourth surface 326a can be a plane. Also in such an arrangement, the first channels 362 can be formed in the surface 304h between the first plate member 322 and the second plate member 324, and the second channels 364 can be formed in the surface 304k between the second plate member 324 and the third plate member 326.

The first concave portions 324d and the second concave portions 326d are formed in the second surface 324a and the third surface 324b, respectively, and the first surface 322a and the fourth surface 326a are the planes, making it also possible to form the first channels 362 and the second channels 364. In this case, however, the concave portions are formed in both the surfaces of the second plate member 324 in the thickness direction, which may result in a disadvantage in manufacture thereof. It is therefore preferable that only one of each first concave portion 324d and each second concave portion 326d is formed in the second plate member 324.

In this embodiment, it is possible, in the stage apparatus 3, to reduce the volume of implementations to be an obstacle to layout in the stage plate 304c, and to suppress an increase in thickness of the stage plate 304c for the pipe and the channels to be formed. It is therefore possible to provide the stage apparatus 3 advantageous in both high stiffness and light weight.

In the imprint apparatus 100, a pressing force is applied to the stage plate 304c in the downward direction (the negative direction along a Z-axis) in the mold pressing step of bringing the mold 4 and the imprint material 1 on the substrate into contact with each other. A release force is applied to the stage plate 304c in the upward direction (the positive direction along the Z-axis) in the mold releasing step of releasing the mold 4 from the cured imprint material 1 on the substrate.

The stage plate 304c may be deformed due to the pressing force and release force described above, and a shift may occur in the relative positions of the mold 4 and the substrate 2. In order to suppress the deformation in the stage plate 304c, the stage plate 304c is preferably thickened to increase its stiffness. On the other hand, if the stage plate 304c is thickened, the weight of the movable unit 302 increases, disabling light weight. Both high stiffness and light weight are required of the stage plate 304c.

Accordingly, it is preferable, as shown in FIG. 5, that a rib structure 370 is formed on the lowest surface of the stage plate 304c, and more specifically, on a surface 326b on the side opposite to the fourth surface 326a of the third plate member 326 which forms the stage plate 304c to thicken the stage plate 304c. As described above, the elevating unit 304e, the Y head 304b (measurement unit), the cooling implementations 304g, the suction implementations 304f, the pressure regulating unit 304i, and the like are fixed to the lower surface or side surfaces of the stage plate 304c. However, the rib structure 370 is formed between them (gap), and thus it never causes an obstacle to layout. In this embodiment, the rib structure 370 is formed along the outer edge of the third plate member 326. Thus, the stage apparatus 3 including the stage plate 304c shown in FIG. 5 can ensure higher stiffness while minimizing an increase in weight by the rib structure 370.

Figure 7:
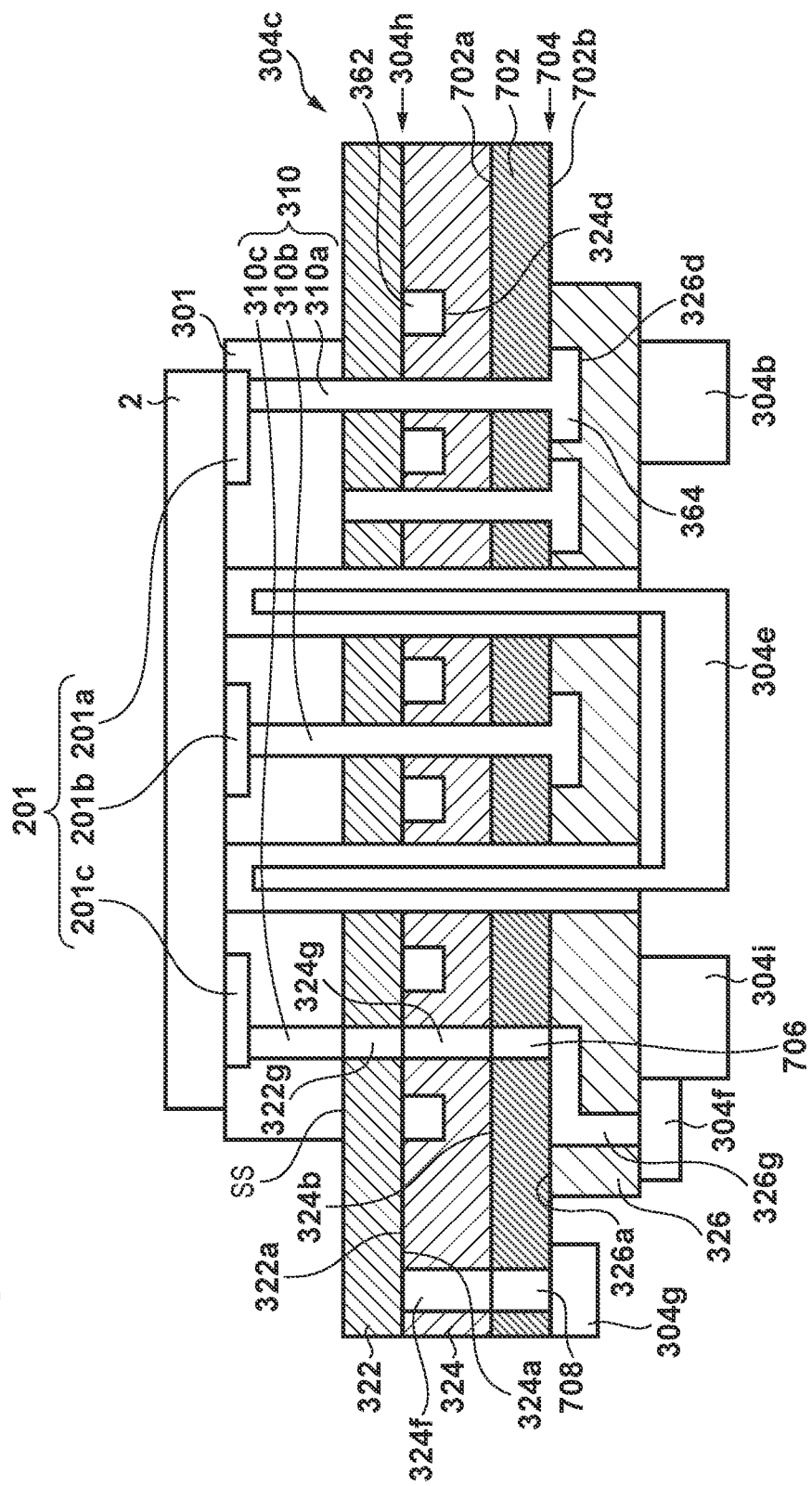
FIG. 7 is a sectional view showing the stage plate of the stage apparatus shown in FIGS. 2A and 2B.

As shown in FIG. 7, the stage plate 304c may further include a fourth plate member 702 between the second plate member 324 and the third plate member 326, in addition to the first plate member 322, the second plate member 324, and the third plate member 326. The first plate member 322, the second plate member 324, the fourth plate member 702, and the third plate member 326 are stacked sequentially from the side of the support surface SS in the thickness direction. In FIG. 7, a surface 702a of the fourth plate member 702 on the side of the second plate member 324 and a surface 702b on the side of the third plate member 326 are planes with respect to the third plate member 326 and the fourth plate member 702, and the second concave portions 326d are formed in the fourth surface 326a. Consequently, the second channels 364 extending in the direction along the X-Y plane are formed in (joint surface) 704 between the fourth plate member 702 and the third plate member 326. The fourth plate member 702 includes through holes 706 formed so as to penetrate in the thickness direction in correspondence with the through holes 324g (through holes 322g). Therefore, the second channels 364 communicate with the chucking holes 310 via the through holes 706, 324g, and 322g, and are connected to the corresponding one of the suction implementations 304f and the pressure regulating unit 304i in communication with the through hole 326g. The fourth plate member 702 also includes a through hole 708 formed so as to penetrate in the thickness direction in correspondence with the through hole 324f. Therefore, the first channels 362 communicate with the through holes 324f and 708, and are connected to the corresponding one of the cooling implementations 304g via the through holes 324f and 708.

In FIG. 7, an example has been described in which the stage plate 304c includes one fourth plate member 702 between the second plate member 324 and the third plate member 326. However, the stage plate 304c may include two or more fourth plate members between the second plate member 324 and the third plate member 326. In this case, the second concave portions 326d form the second channels 364 between the third plate member 326 and the fourth plate member out of two or more fourth plate members stacked on the third plate member 326. On the other hand, when the second concave portions 326d are formed in the third surface 324b, the second concave portions 326d form the second channels 364 between the second plate member 324 and the fourth plate member out of two or more fourth plate members stacked on the second plate member 324. Note that even when the stage plate 304c includes two or more fourth plate members, through holes are formed in the respective fourth plate members so that the first channels 362 can be connected to the cooling implementations 304g, and the second channels 364 can be connected to the chucking holes 310, the suction implementations 304f, and the pressure regulating unit 304i.

Figure 8:
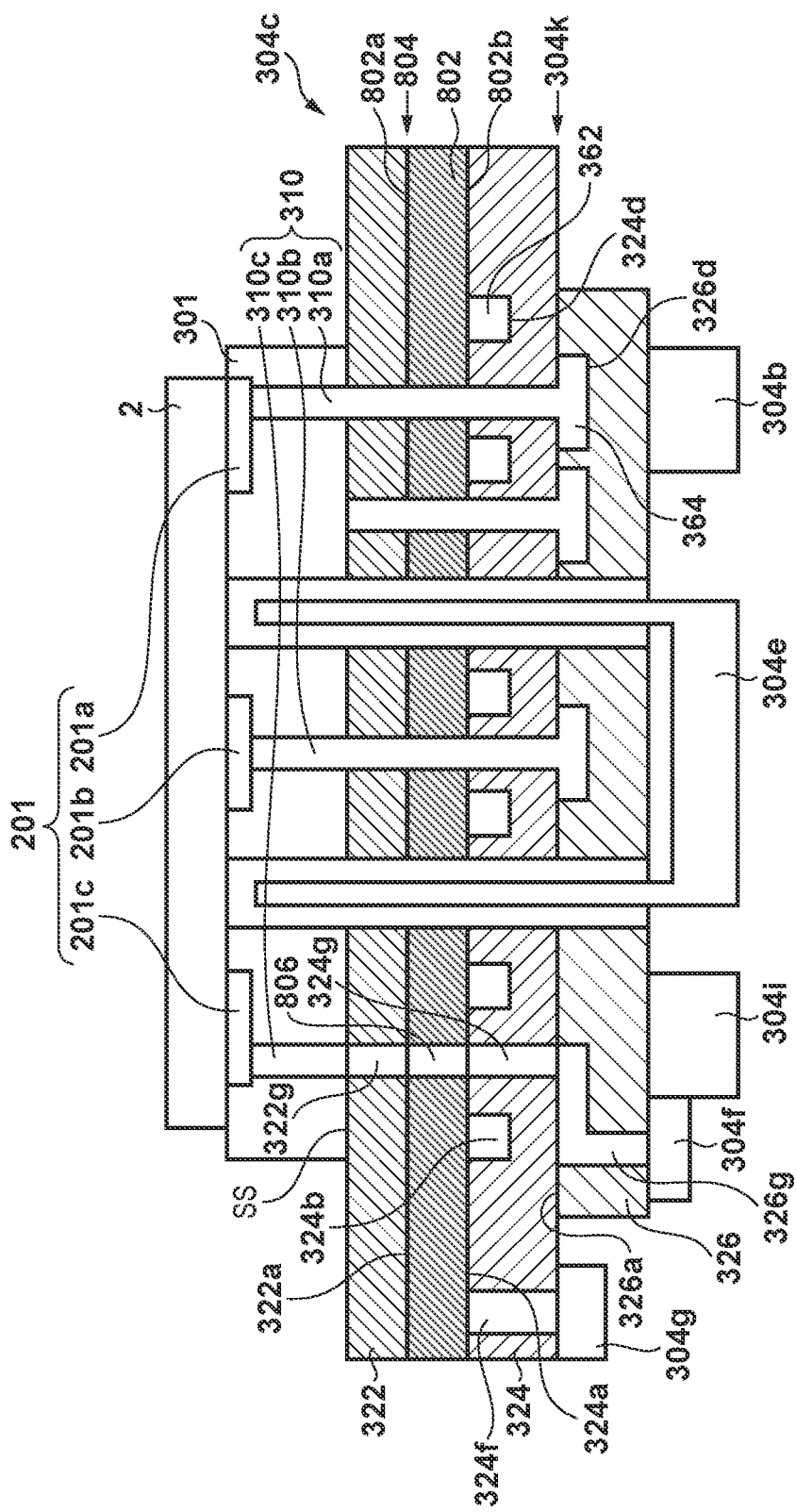
FIG. 8 is a sectional view showing the stage plate of the stage apparatus shown in FIGS. 2A and 2B.

As shown in FIG. 8, the stage plate 304c may further include a fifth plate member 802 between the first plate member 322 and the second plate member 324, in addition to the first plate member 322, the second plate member 324, and the third plate member 326. The first plate member 322, the fifth plate member 802, the second plate member 324, and the third plate member 326 are stacked sequentially from the side of the support surface SS in the thickness direction. In FIG. 8, a surface 802a of the fifth plate member 802 on the side of the first plate member 322 and a surface 802b on the side of the second plate member 324 are planes with respect to the second plate member 324 and the fifth plate member 802, and the first concave portions 324d are formed in the second surface 324a. Consequently, the first channels 362 extending in the direction along the X-Y plane are formed in (joint surface) 804 between the fifth plate member 802 and the second plate member 324. The fifth plate member 802 includes through holes 806 formed so as to penetrate in the thickness direction in correspondence with the through holes 324g (through holes 322g). Therefore, the second channels 364 communicate with the chucking holes 310 via the through holes 324g, 806, and 322g, and are connected to the corresponding one of the suction implementations 304f and the pressure regulating unit 304i in communication with the through hole 326g.

In FIG. 8, an example has been described in which the stage plate 304c includes one fifth plate member 802 between the first plate member 322 and the second plate member 324. However, the stage plate 304c may include two or more fifth plate members between the first plate member 322 and the second plate member 324. In this case, the first concave portions 324d form the first channels 362 between the second plate member 324 and the fifth plate member out of two or more fifth plate members stacked on the second plate member 324. On the other hand, when the first concave portions 324d are formed in the first surface 322a, the first concave portions 324d form the first channels 362 between the first plate member 322 and the fifth plate member out of two or more fifth plate members stacked on the first plate member 322. Note that even when the stage plate 304c includes two or more fifth plate members, through holes are formed in the respective fifth plate members so that the second channels 364 can be connected to the chucking holes 310, the suction implementations 304f, and the pressure regulating unit 304i.

The pattern of the cured product that has been formed using the imprint apparatus 100 is used permanently for at least some of various articles or used temporarily when the various articles are manufactured. The article includes an electric circuit element, an optical element, a MEMS, a printing element, a sensor, a die, or the like. The electric circuit element includes, for example, a volatile or nonvolatile semiconductor memory such as a DRAM, an SRAM, a flash memory, or an MRAM or a semiconductor element such as an LSI, a CCD, an image sensor, or an FPGA. The die includes an imprinting mold or the like.

The pattern of the cured product is used without any change as a constituent member of at least a part of the above-described article or used temporarily as a resist mask. The resist mask is removed after etching, ion implantation, or the like is performed in a processing step of the substrate.

Figure 6A:
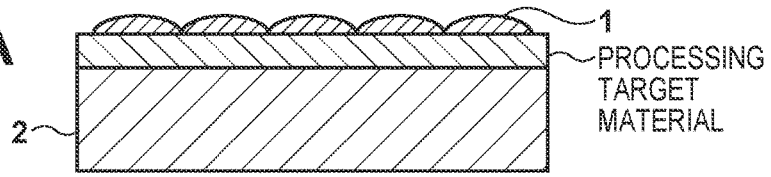
FIGS. 6A to 6F are views for explaining a method of manufacturing an article.

A detailed method of manufacturing the article will now be described. As shown FIG. 6A, the substrate 2 such as a silicon wafer having a processing target material such as an insulator formed on its surface is prepared, and then an imprint material 1 is applied on the surface of the processing target material by an inkjet method or the like. A state is shown here in which the imprint material 1 formed into a plurality of droplets is applied on the substrate.

Figure 6B:
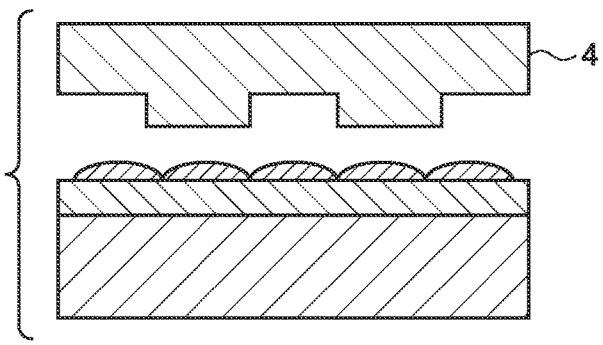
Figure 6C:
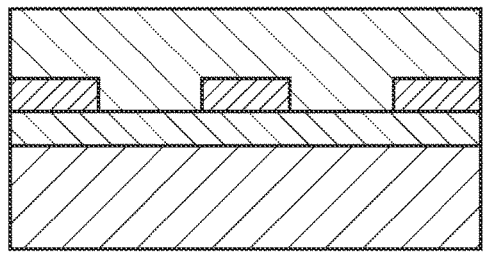

As shown in FIG. 6B, a side of the imprinting mold 4 on which its three-dimensional pattern is formed faces the imprint material 1 on the substrate. As shown in FIG. 6C, the mold 4 and the substrate 2 to which the imprint material 1 is applied are brought into contact with each other, applying a pressure. The imprint material 1 fills the gap between the mold 4 and the processing target material. The imprint material 1 is cured by irradiating it with light as curing energy through the mold 4 in this state.

Figure 6D:
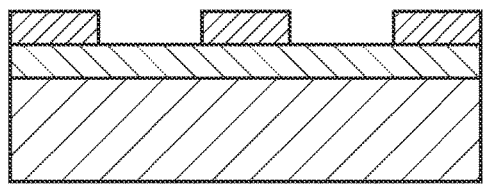

As shown in FIG. 6D, the pattern of the cured product of the imprint material 1 is formed on the substrate by separating the mold 4 and the substrate 2 from each other after curing the imprint material 1. The pattern of this cured product has a shape such that the concave portion of the mold 4 corresponds to the convex portion of the cured product, and the convex portion of the mold 4 corresponds to the concave portion of the cured product. That is, the three-dimensional pattern of the mold 4 is transferred to the imprint material 1.

Figure 6E:
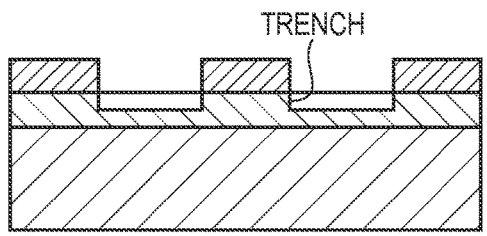
Figure 6F:
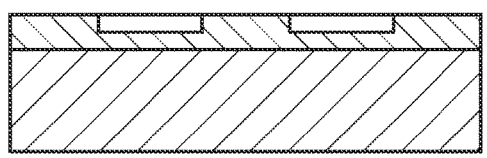

As shown in FIG. 6E, out of the surface of the processing target material, portions without the cured product or portions where the cured products remain thin are removed and become trenches by performing etching using the pattern of the cured product as an etching resistant mask. As shown in FIG. 6F, an article having the trenches formed on the surface of the processing target material can be obtained by removing the pattern of the cured product. The pattern of the cured product is removed here. However, the pattern of the cured product may be utilized as, for example, an interlayer dielectric film included in the semiconductor element or the like, that is, the constituent member of the article without removing it even after processing.

The present invention does not limit the lithography apparatus to the imprint apparatus and can also be applied to lithography apparatuses such as an exposure apparatus and a drawing apparatus. Note that the exposure apparatus is the lithography apparatus which forms a pattern (latent pattern) on the substrate by exposing the substrate via a mask or a reticle (original) and a projection optical system. The drawing apparatus is the lithography apparatus which forms a pattern (latent pattern) on the substrate by performing drawing on the substrate with a charged particle beam (electron beam). These lithography apparatuses may be used to manufacture the various articles described above.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent application Nos. 2016-139696 filed on Jul. 14, 2016, and 2017-095848 filed on May 12, 2017, which are hereby incorporated by reference herein in their entirety.

What is claimed is:

1. A stage apparatus which holds a substrate via a chuck with a chucking hole for chucking the substrate, the apparatus comprising:
   a plate configured to support the chuck on a support surface, wherein the plate includes a first plate member, a second plate member, and a third plate member from a side of the support surface in a thickness direction, at least one surface out of a first surface of the first plate member on a side of the second plate member and a second surface of the second plate member on a side of the first plate member includes a first concave portion configured to form a first channel extending in a direction along the surface, at least one surface out of a third surface of the second plate member on a side of the third plate member and a fourth surface of the third plate member on the side of the second plate member includes a second concave portion configured to form a second channel extending in a direction along the surface, and one of the first channel and the second channel communicates with the chucking hole.

2. The apparatus according to claim 1, wherein the first plate member, the second plate member, and the third plate member are stacked sequentially from the side of the support surface in the thickness direction, the first concave portion forms the first channel between the first plate member and the second plate member, and the second concave portion forms the second channel between the second plate member and the third plate member.

3. The apparatus according to claim 2, wherein the first concave portion is formed only in one surface out of the first surface and the second surface, and the second concave portion is formed only in one surface out of the third surface and the fourth surface.

4. The apparatus according to claim 3, wherein the other surface out of the first surface and the second surface is a plane, and the other surface out of the third surface and the fourth surface is a plane.

5. The apparatus according to claim 2, wherein only one concave portion out of the first concave portion and the second concave portion is formed in the second plate member.

6. The apparatus according to claim 2, wherein the first concave portion is formed in the second surface, the second concave portion is formed in the fourth surface, and the first surface and the third surface are planes.

7. The apparatus according to claim 2, wherein the second plate member includes a first through hole formed, so as to penetrate in the thickness direction, in a portion different from a portion in which the first channel is formed, the first plate member includes a second through hole formed so as to penetrate in the thickness direction in correspondence with the first through hole, and the second channel communicates with the chucking hole via the first through hole and the second through hole.

8. The apparatus according to claim 7, wherein a refrigerant for cooling the chuck flows through the first channel.

9. The apparatus according to claim 7, wherein the chuck includes a plurality of chucking regions for chucking the substrate, the chucking hole is formed in each of the plurality of chucking regions, and the second channel is formed in correspondence with each of the plurality of chucking regions.

10. The apparatus according to claim 7, wherein the third plate member includes a third through hole formed, so as to penetrate in the thickness direction, in a peripheral portion of the third plate member, and the second channel communicates with the third through hole.

11. The apparatus according to claim 7, wherein the third plate member includes a communication path configured to make side surfaces and the fourth surface of the third plate member communicate with each other, and the second channel communicates with the communication path.

12. The apparatus according to claim 7, wherein the second plate member includes a fourth through hole formed, so as to penetrate in the thickness direction, in a peripheral portion of the second plate member, and the first channel communicates with the fourth through hole.

13. The apparatus according to claim 12, wherein the third plate member includes a fifth through hole formed so as to penetrate in the thickness direction in correspondence with the fourth through hole, and the first channel communicates with the fourth through hole and the fifth through hole.

14. The apparatus according to claim 1, wherein the third plate member has a rib structure formed on a surface on a side opposite to the fourth surface, and the rib structure is formed along an outer edge of the third plate member.

15. The apparatus according to claim 1, wherein the plate further includes at least one fourth plate member between the second plate member and the third plate member, the first plate member, the second plate member, the at least one fourth plate member, and the third plate member are stacked from the side of the support surface in the thickness direction, the first concave portion forms the first channel between the first plate member and the second plate member, and the second concave portion forms the second channel in at least one of a portion between the second plate member and the fourth plate member upon which the second plate member is stacked out of the at least one the fourth plate member, and a portion between the third plate member and the fourth plate member stacked on the third plate member out of the at least one the fourth plate member.

16. The apparatus according to claim 1, wherein the plate further includes at least one fifth plate member between the first plate member and the second plate member, the first plate member, the at least one fifth plate member, the second plate member, and the third plate member are stacked from the side of the support surface in the thickness direction, the first concave portion forms the first channel in at least one of a portion between the first plate member and the fifth plate member upon which the first plate member is stacked out of the at least one fifth plate member, and a portion between the second plate member and the fifth plate member stacked on the second plate member out of the at least one fifth plate member, and the second concave portion forms the second channel between the second plate member and the third plate member.

17. A lithography apparatus which forms a pattern on a substrate, the apparatus comprising:

a stage apparatus configured to hold the substrate via a chuck with a chucking hole for chucking the substrate, wherein the stage apparatus includes:

a plate configured to support the chuck on a support surface, wherein the plate includes a first plate member, a second plate member, and a third plate member from a side of the support surface in a thickness direction, at least one surface out of a first surface of the first plate member on a side of the second plate member and a second surface of the second plate member on a side of the first plate member includes a first concave portion configured to form a first channel extending in a direction along the surface, at least one surface out of a third surface of the second plate member on a side of the third plate member and a fourth surface of the third plate member on the side of the second plate member includes a second concave portion configured to form a second channel extending in a direction along the surface, and one of the first channel and the second channel communicates with the chucking hole.

18. The apparatus according to claim 17, wherein the apparatus is configured for an imprint process of forming, using a mold, a pattern in an imprint material on the substrate held by the stage apparatus.

19. A method of manufacturing an article, the method comprising:

forming a pattern on a substrate using a lithography apparatus; and processing the substrate, on which the pattern has been formed, to manufacture the article, wherein the lithography apparatus includes:

a stage apparatus configured to hold the substrate via a chuck with a chucking hole for chucking the substrate, and the stage apparatus includes:

a plate configured to support the chuck on a support surface, wherein the plate includes a first plate member, a second plate member, and a third plate member from a side of the support surface in a thickness direction, at least one surface out of a first surface of the first plate member on a side of the second plate member and a second surface of the second plate member on a side of the first plate member includes a first concave portion configured to form a first channel extending in a direction along the surface, at least one surface out of a third surface of the second plate member on a side of the third plate member and a fourth surface of the third plate member on the side of the second plate member includes a second concave portion configured to form a second channel extending in a direction along the surface, and one of the first channel and the second channel communicates with the chucking hole.

* * * * *